(12) United States Patent
Imai et al.

(10) Patent No.: US 6,527,851 B2
(45) Date of Patent: Mar. 4, 2003

(54) PROCESS FOR PRODUCING A PLANAR BODY OF AN OXIDE SINGLE CRYSTAL

(75) Inventors: Katsuhiro Imai, Nagoya (JP); Akihiko Honda, Nagoya (JP); Minoru Imaeda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/798,750

(22) Filed: Mar. 2, 2001

(65) Prior Publication Data
US 2001/0020436 A1 Sep. 13, 2001

(30) Foreign Application Priority Data

Mar. 9, 2000 (JP) .................. 2000-065132
Jan. 26, 2001 (JP) .................. 2001-018096

(51) Int. Cl.$^7$ ............................ C30B 15/08
(52) U.S. Cl. ................................. 117/16
(58) Field of Search ................ 117/13, 19, 16

(56) References Cited

U.S. PATENT DOCUMENTS 5,690,734 A    11/1997  Imaeda et al.
5,961,720 A    10/1999  Imaeda et al.
6,036,775 A  * 3/2000   Imaeda et al. ........... 117/214

FOREIGN PATENT DOCUMENTS

EP   0 733 728 A2   9/1996
EP   0 737 884 A2   10/1996   ........... G02F/1/37
FR   2 321 326 A    3/1977    ........... B01J/17/06
JP   8-319191       12/1996

OTHER PUBLICATIONS

Chani V I et al.: "Segregation and Uniformity of $K_3Li_2(Ta, Nb)_5O_{15}$ Fiber Crystals Grown by Micro–pulling–down Method" Journal of Crystal Growth, NL, North Holland Publishing Co. Amsterdam, vol. 194, No. 3/04, Dec. 1998, pp. 374–378, XP000669101 ISSN: 0022–0248.

Rudd et al.: "Growth of Lithium Tantalate . . . " Solid State Technology., vol. 17, No. 1, Jan. 1974, pp. 52–55, XP002171183 Cowan Publ. Corp. Washington, US ISSN: 0038–111X.

Patent Abstracts of Japan, vol. 1997, No. 04, Apr. 30, 1997 & JP 08 319191 A, Dec. 3, 1996.

K. Kitamura, et al., *Stoichiometric $LiNbO_3$ Single Crystal Growth by Double Crucible Czochralski Method Using Automatic Powder Supply System*, Journal of Crystal Growth, vol. 116 (1992), pp. 327–332.

D.H. Yoon, et al., *Morphological Aspects of Potassium Lithium Niobate Crystals with Acicular Habit Grown by the Micro–Pulling–Down Method*, Journal of Crystal Growth, vol. 144 (1994), pp. 207–212.

* cited by examiner

Primary Examiner—Benjamin L. Utech
Assistant Examiner—Matthew Anderson
(74) Attorney, Agent, or Firm—Burr & Brown

(57) ABSTRACT

A planar body with a good crystallinity is grown continuously and stably when a planar body of an oxide single crystal is grown by a micro pulling-down method. A raw material of the oxide single crystal is melted in a crucible 7. A fibrous seed crystal 15 is contacted to a melt 18, and then the melt 18 is pulled down from an opening 13c of the crucible 7 by lowering the seed crystal. A shoulder portion 14A is produced following the seed crystal, and a planar body 14B is produced following the shoulder portion. In this case, differences in lattice constants between each crystal axis of the seed crystal and each corresponding crystal axis of the shoulder portion are controlled at 1% or less, respectively.

5 Claims, 2 Drawing Sheets

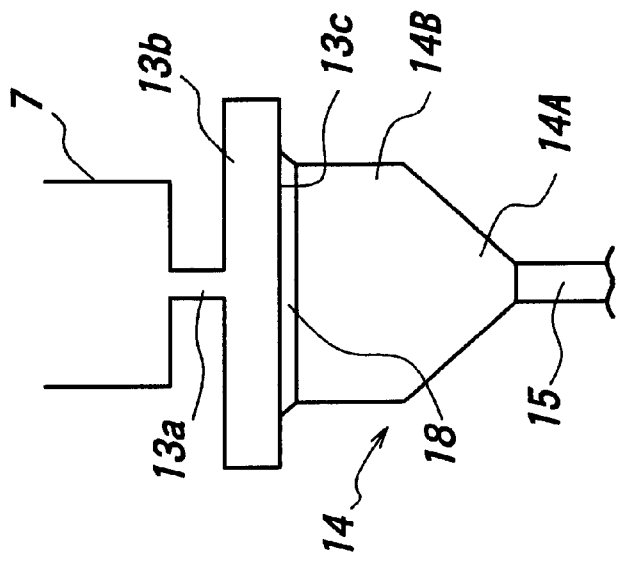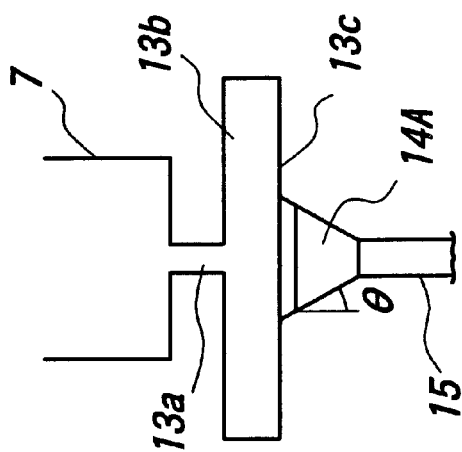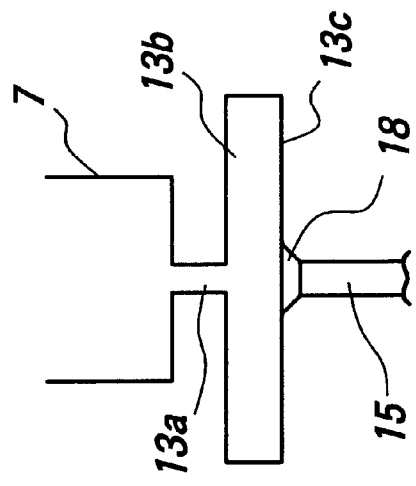

PROCESS FOR PRODUCING A PLANAR BODY OF AN OXIDE SINGLE CRYSTAL

BACKGROUND OF THE INVENTION

1. Field of the Invention

The invention relates to a process for producing a planar body of an oxide single crystal.

2. Description of the Related Art

A single crystal of lithium potassium niobate and a single crystal of lithium potassium niobate-lithium potassium tantalate solid solution have been noted especially as single crystals for a blue light second harmonic generation (SHG) device for a semiconductor laser. The device can emit even ultraviolet light having wavelengths on the order of 390 nm, thus the crystals can be suitable for wide applications such as optical disk memories, medical and photochemical fields, and various optical measurements by using such short-wavelength lights. Since the above single crystals have a large electro-optic effect, they also can be applied to optical memory devices using their photo-refractive effect.

However, for an application of a second harmonic generation device, for example, even a small fluctuation in the composition of the single crystal may affect the wavelength of the second harmonic wave generated by the device. Therefore, the specification of the range of the composition required for such single crystals is severe, and any fluctuation in the composition should be suppressed to a narrow range. However, since the composition consists of as many as three or four components, growing a single crystal at a high rate is generally extremely difficult to achieve, while controlling the proportion of the components to be constant.

In addition, for optical applications, especially for an application for the second harmonic wave generation, a laser beam having a short wavelength of, for example, about 400 nm needs to propagate in the single crystal at the highest power density possible. Moreover, photo deterioration has to be controlled to the minimum at the same time. In this way, since controlling the photo deterioration is essential, the single crystal has to possess a good crystallinity for this purpose.

Moreover, lithium niobate and lithium potassium niobate can be substituted with cations, thus a solid solution, in which the cations are solid-solved, is produced. Therefore, controlling the composition of the melt is necessary to grow a single crystal of a specific composition. From such a background, a double crucible method and a method of growing a crystal while feeding raw materials are examined mainly for the CZ method and the TSSG method. For example, Kitamura et al. tried to grow a lithium niobate single crystal of a stoichiometric composition by combining an automatic powder feeder to a double crucible CZ method (J. Crystal Growth, 116 (1992), p.327). However, it was difficult to enhance the crystal growth rate with these methods.

NGK Insulators, Ltd. suggested a micro pulling-down method for growing the above single crystal with constant compositional proportions, for example, in JP-A-8-319191. In this method, a raw material, for example, lithium potassium niobate, is put into a platinum crucible and melted, and then the melt is pulled down gradually and continuously through a nozzle attached to the bottom of the crucible. The micro pulling-down method can grow a single crystal more rapidly than the CZ method or the TSSG method. Moreover, the compositions of the melt and the grown single crystal can be controlled by growing the single crystal continuously with feeding the raw materials for growing the single crystal to the raw material melting crucible.

However, there is still a limitation in using a micro pulling-down method to grow a good single crystal plate (a planar body of a single crystal) continuously at a high rate. That is, when the planar body of the single crystal is pulled down with a planar seed crystal, cracks tend to occur near an interface boundary between the seed crystal and the planar body.

The inventors found that cracks were likely to occur as the difference in lattice constant between the seed crystal and the planar body became greater, and suggested a method for preventing cracks by matching the lattice constant of the seed crystal with that of the planar body at a high accuracy in Japanese Patent application No. 2000-065123 (filed on Mar. 9, 2000). However, it was practically very difficult for a multi-component solid solution system as in lithium potassium niobate-lithium potassium tantalate solid solution to match the lattice constant of a seed crystal with that of a planar body at a high accuracy.

It is an object of the invention to prevent cracks from occurring near the interface boundary between a seed crystal and a planar body, and to grow a planar body of an oxide single crystal having a good crystallinity continuously and stably with a simple technique, when the planar body of the oxide single crystal is grown with the micro pulling-down method.

SUMMARY OF THE INVENTION

The inventors examined various methods to grow planar bodies of oxide single crystals which used the micro pulling-down method. As a result, the inventors found that cracks were more unlikely to occur as the area of the interface boundary between the seed crystal and the planar body became smaller. Thus, a planar body having a good crystallinity was continuously made by melting a raw material of an oxide single crystal in a crucible, contacting a fibrous seed crystal to a melt, pulling down the melt from the opening of a crucible by lowering the seed crystal, forming a shoulder portion following the seed crystal, forming a planar body following the shoulder portion, and controlling differences in lattice constants between each crystal axis of the seed crystal and each corresponding crystal axis of the shoulder portion at 1% or less (more preferably 0.5% or less), respectively.

In this case, the lattice constant of each crystal axis of the shoulder portion can be adjusted by controlling the proportions of respective components in the crucible. Taking lithium potassium niobate for an example, the lattice constants of each crystal axis in the grown planar body can be changed by slightly changing the relative ratio of niobium, lithium and potassium in the crucible.

BRIEF DESCRIPTION OF THE DRAWINGS

FIGS. 2(a) through (c) represent steps of pulling down a planar body of the single crystal.

DETAILED DESCRIPTION OF THE INVENTION

Figure 1:
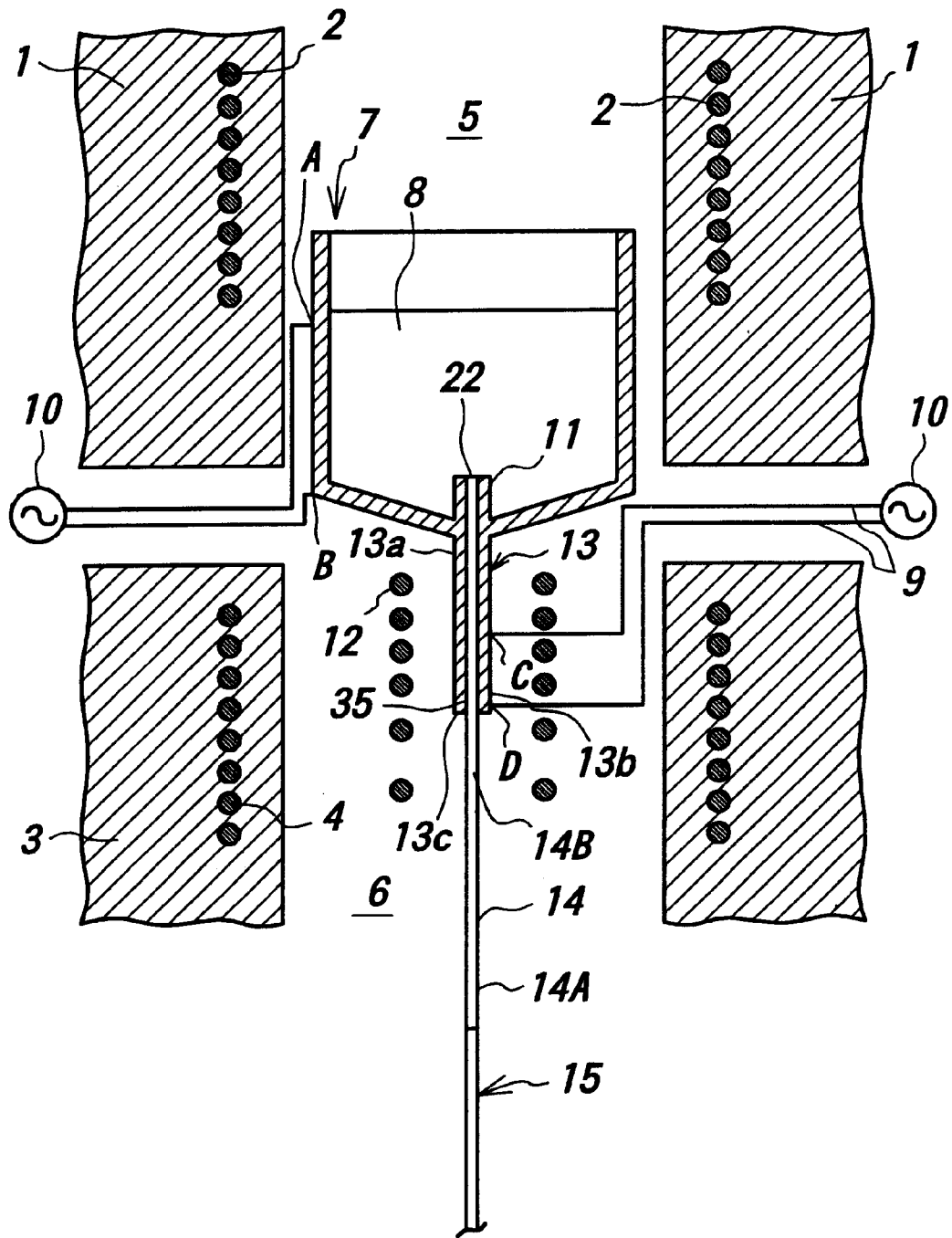
FIG. 1 is a schematic sectional view of a manufacturing apparatus for growing a single crystal.

A crucible 7 is placed in a furnace body. An upper furnace unit 1 is arranged to surround the crucible 7 and an upper space 5 thereof, and has a heater 2 buried therein. A nozzle 13 extends downwardly from a bottom part of the crucible 7. The nozzle 13 comprises a connecting-tube portion 13a and a planar expanded portion 13b at the lower end of the connecting-tube portion 13a. In FIG. 1, only a cross sectional view of the planar expanded portion 13b is shown. The connecting-tube portion 13a and the planar expanded portion 13b can be changed variously in shape. Both 13a and 13b can also be arbitrarily changed in combination. A slender opening 13c is formed at the lower end of the planar expanded portion 13b, and a vicinity of the opening 13c is a single crystal-growing portion 35. A lower furnace unit 3 is arranged to surround the nozzle 13 and a surrounding space 6 thereof, and has a heater 4 buried therein. The crucible 7 and the nozzle 13 are both formed from a corrosion-resistant conductive material.

One electrode of a power source 10 is connected to a point A of the crucible 7 with an electric cable 9, and the other electrode of the power source 10 is connected to a lower bend B of the crucible 7. One electrode of another power source 10 is connected to a point C of the connecting-tube portion 13a with an electric cable 9, and the other electrode of the power source 10 is connected to a lower end D of the planar expanded portion 13b. These current-carrying systems are isolated from each other and configured to control their voltages independently.

An after-heater 12 is located in the space 6 to surround the nozzle 13 with a distance. An intake tube 11 extends upwardly in the crucible 7 and an intake opening 22 is provided at the upper end of the intake tube 11. The intake opening 22 slightly protrudes from a bottom portion of a melt 8.

The upper furnace unit 1, the lower furnace unit 3 and the after-heater 12 are allowed to heat for setting an appropriate temperature distribution in each of the space 5 and space 6. Then a raw material for the melt is supplied into the crucible 7 and electricity is supplied to the crucible 7 and the nozzle 13 for heating. In this condition, the melt slightly protrudes from the opening 13c at the single crystal-growing portion 35.

In this condition, a fibrous seed crystal 15 is moved upwardly as shown in FIG. 2(a), and the upper surface of the seed crystal 15 is contacted with the melt protruding from the opening 13c. At that time, a uniform solid phase-liquid phase interface (meniscus) is formed between the upper end of the seed crystal 15 and the melt 18 pulled downwardly from the nozzle 13. Then, the seed crystal 15 is lowered as shown in FIG. 2(b). As a result, a shoulder portion 14A is continuously formed on an upper side of the seed crystal 15 and pulled downwardly.

The width of the shoulder portion 14A gradually increases from the seed crystal to the crucible. The angle of the shoulder portion depends on the type and the composition of the crystal, the temperature of the single crystal-growing portion 35, the pulling-down rate, and the like. When the temperature of the single crystal-growing portion 35 is raised a little, the shoulder portion 14A stops increasing its width, and a planar body 14B having a constant width is continuously grown after that.

A smaller contact area between the melt and the seed crystal is preferable from the viewpoint of preventing cracks. However, the seed crystal may break due to a lack of strength when the seed crystal is too thin. Therefore, regardless of the width of the planar body, the seed crystal preferably has a width of 1–3 mm.

The lattice constant is measured by an X-ray diffraction apparatus (MRD diffractometer, manufactured by Philips). If an unequivalent crystal axis exists in an oxide single crystal, differences in lattice constants between each crystal axis of the seed crystal and each corresponding crystal axis of the shoulder portion, respectively, have to be 1% or less.

An oxide single crystal is not particularly limited, but, for example, lithium potassium niobate (KLN), lithium potassium niobate-lithium potassium tantalate solid solution (KLTN: [$K_3Li_{2-x}(Ta_yNb_{1-y})_{5+x}O_{15+2x}$]), lithium niobate, lithium tantalate, lithium niobate-lithium tantalate solid solution, $Ba_{1-x}Sr_xNb_2O_6$, Mn—Zn ferrite, yttrium aluminum garnet substituted with Nd, Er and/or Yb, YAG, and $YVO_4$ substituted with Nd, Er, and/or Yb can be exemplified.

EXAMPLE 1

With a single crystal-producing apparatus shown in FIG. 1, a planar body of a lithium potassium niobate single crystal was produced according to the invention. Specifically, the temperature of the whole furnace was controlled by the upper furnace unit 1 and the lower furnace unit 3. The apparatus was configured to be able to control the temperature gradient near the single crystal-growing portion 35 by an electric supply to the nozzle 13 and the heat generation of the after-heater 12. The mechanism of pulling down the single crystal plate was equipped, in which a single crystal plate was pulled down by controlling the pulling-down rate uniformly within a range from 2 to 100 mm/hour in a vertical direction.

A fibrous seed crystal of lithium potassium niobate was used. The size of the seed crystal was 1 mm×1 mm in cross-section and 15 mm in length. Lattice constants of the seed crystal were 12.60 Å in the a-axis and 3.97 Å in the c-axis. The molar ratio of potassium, lithium and niobium was 30:14:56. The half width of an X-ray rocking curve was 80 seconds at the 0 0 4 reflection of the seed crystal (measured by the MRD diffractometer, manufactured by Philips). The seed crystal was held at a holding rod with a heat-resistance inorganic adhesive, and the holding rod was connected to the pulling-down mechanism.

Potassium carbonate, lithium carbonate and niobium pentoxide were prepared at a molar ratio of 30:25:45 to produce a raw material powder. The raw material was supplied into the platinum crucible 7, and the crucible 7 was set in place. With controlling the temperature of the space 5 in the upper furnace unit 1 to be within a range from 1100 to 1200° C., the raw material in the crucible 7 was melted. The temperature of the space 6 in the lower furnace unit 3 was controlled uniformly to be within a range from 500 to 1000° C. While a given electric power was supplied to each of the crucible 7, the nozzle 13 and the after-heater 12, a single crystal was grown. In this case, the temperature of the single crystal-growing portion could be controlled at 980–1150° C., and the temperature gradient of the single crystal-growing portion could be controlled at 10–150° C./mm.

The crucible 7 had an elliptical cross-sectional shape, wherein the major axis, the minor axis and the height were 50 mm, 10 mm and 10 mm, respectively. The length of the connecting-tube portion was 5 mm. The cross-sectional dimension of the planar expanded portion 13b was 1 mm×50 mm. The dimension of the opening 13c was 1 mm long×50 mm wide. Under such conditions, the seed crystal 15 was pulled down at a rate of 10 mm/hour.

As a result, a solid phase-liquid phase interface descended and the lower portion of the melt band was cooled to a temperature below its crystallizing point to gradually crystallize a single crystal at an upper end of the seed crystal.

When the seed crystal was further lowered, single-crystallization continuously progressed to form the shoulder portion 14A. When the temperature of the single crystal-growing portion was lowered by changing temperatures of the crucible 7, the nozzle 13 and/or the after-heater 12, single-crystallization was enhanced to increase the spreading angle θ of the shoulder portion 14A. In case of the spreading angle θ being too large, the spreading angle θ was controlled by raising the temperature of the single crystal-growing portion 35. The spreading angle θ was kept constant at about 30 degrees. While controlling the spreading angle θ, the shoulder portion 14A was kept growing. The area of the shoulder portion 14A gradually increased to finally reach 35 mm wide and 1 mm thick. At this time, the width of the planar body 14B was uniformly controlled at 35 mm by suppressing the crystallization through raising the temperature of the single crystal-growing portion 35.

While the raw material in equal weight to that of the crystallized melt was being fed to the crucible 7, the crystal was kept growing, and the planar body was cut off from the nozzle 13 and cooled when the total length of the shoulder portion 14A and the planar body 14B reached 100 mm. The lattice constant of the shoulder portion of the obtained planar body was measured to give the a-axis length of 12.58 Å and the c-axis length of 4.01 Å. The molar ratio of potassium, lithium and niobium was 30:17:53, respectively. The difference between the lattice constant of the shoulder portion and that of the seed crystal (lattice mismatch) was 0.15% in the a-axis and 1.0% in the c-axis. However, no crack occurred at the joining portion between the seed crystal and the shoulder portion. Also, the half width of an X-ray rocking curve was 50 seconds at the 0 0 4 reflection of the shoulder portion.

EXAMPLE 2

Similar results as Example 1 were obtained with a plate of lithium potassium niobate-lithium potassium tantalate solid solution single crystal.

EXAMPLE 3

A planar body of lithium niobate was grown according to Example 1 except that a fibrous seed crystal of lithium niobate was used. The dimensions of the seed crystal were 1 mm×1 mm in cross-section and 15 mm in length. The seed crystal was cut out and obtained from a stoichiometric lithium niobate single crystal grown by the Czochralski method. The direction of pulling down the seed crystal was set parallel to the X-axis, and the direction of the growing face was set parallel to the Z-axis. The lattice constant of the seed crystal was 5.150 Å in the a-axis and 13.864 Å in the c-axis. The molar ratio of lithium and niobium was 48.6:51.4, respectively. The half width of an X-ray rocking curve was 12 seconds at 0 0 12 reflection of the seed crystal.

Lithium carbonate and niobium pentoxide were prepared at the molar ratio of 58:42 to produce a raw material powder. The raw material was fed into the platinum crucible 7, and the crucible 7 was arranged in a predetermined place. While the temperature of the space 5 in the upper furnace unit 1 was controlled to be within a range from 1200 to 1300° C., the raw material in the crucible 7 was melted. A temperature of the space 6 in the lower furnace unit 3 was controlled uniformly to be within a range from 500 to 1000° C. While predetermined electric power was supplied to each of the crucible 7, the nozzle 13 and the after-heater 12, a single crystal was grown. In this case, the temperature of the single crystal-growing portion could be controlled at 1200–1250° C., and the temperature gradient of the single crystal growing portion could be controlled at 10–150° C./mm. The seed crystal was lowered at a rate of 30 mm/hour. The volume of the crystallized lithium niobate was measured to convert it to a weight every unit time internally, and the raw material of lithium niobate in equal weight to the converted one was supplied into the crucible. In this case, unlike the raw material powder melted at the beginning, the lithium niobate powder supplied afterward in such manner was prepared to have a molar ratio of lithium and niobium at 50:50. When the width of the shoulder portion 14A reached 50 mm, a planar body 14B having the width of 50 mm was grown by controlling the temperature of the nozzle 13.

While the raw material powder of lithium niobate was being fed, the crystal was continuously grown until the total length of the shoulder portion 14A and the planar body 14B reached 100 mm. Then the planar body was cut off from the nozzle 13 and cooled.

The composition of the shoulder portion of the obtained planar body was measured by an inductively coupled plasma method, and the molar ratio of lithium and niobium was 50:50, which corresponded to the stoichiometric composition. The lattice constant of the planar body was measured to give an a-axis length of 5.148 Å and a c-axis length of 13.857 Å. Differences in lattice constant between the shoulder portion and the seed crystal (lattice mismatch) were 0.04% in the a-axis and 0.05% in the c-axis. No cracks occurred at the joining portion between the seed crystal and the shoulder portion. The half width of an X-ray rocking curve was 12 seconds at the shoulder portion.

EXAMPLE 4

A planar body was grown according to Example 3 except that the seed crystal was worked so that a direction of pulling down the seed crystal was parallel to the Z-axis, and that a direction of growing face was parallel to the X-axis. The a-axis length, the c-axis length and the half width of the X-ray rocking curve at the seed crystal and the shoulder portion were similar to those in Example 3. No cracks occurred at the joining face between the shoulder portion and the seed crystal.

As mentioned above, according to the invention, when the planar body of the oxide single crystal was grown by the micro pulling-down method, cracks can be prevented near an interface between the seed crystal and the planar body, and the planar body with good crystallinity can be grown continuously and stably.

What is claimed is:

1. A process for producing a planar body of an oxide single crystal, said process comprising the steps of:

melting a raw material of said oxide single crystal in a crucible;

contacting a fibrous seed crystal to the melt;

pulling down said melt from an opening of said crucible by lowering the seed crystal;

forming a shoulder portion following said seed crystal; and producing said planar body following the shoulder portion, wherein differences in lattice constants between each crystal axis of said seed crystal and each corresponding crystal axis of said shoulder portion are 1% or less, respectively.

2. The process for producing a planar body according to claim 1, wherein said differences in lattice constants between each crystal axis of said seed crystal and each corresponding crystal axis of said shoulder portion are adjusted by controlling a proportion of each component in the crucible.

3. The process for producing a planar body according to claim 1, wherein said shoulder portion stops increasing its width and then said planar body, having a substantially constant width, is continuously pulled out by raising the temperature of a single crystal-growing portion.

4. The process for producing a planar body according to claim 1, wherein a spreading angle of said shoulder portion is controlled by controlling the temperature of a single crystal-growing portion.

5. The process for producing a planar body according to claim 1, wherein said shoulder portion, when viewed in a direction perpendicular to a main surface of said planar body, increases in width as said shoulder portion extends from said fibrous seed crystal toward said planar body.

* * * * *